(12) United States Patent
Miyata et al.

(10) Patent No.: US 7,626,229 B2
(45) Date of Patent: Dec. 1, 2009

(54) SEMICONDUCTOR DEVICE AND METHOD FOR FABRICATING THE SAME

(75) Inventors: Satoe Miyata, Kyoto (JP); Shuji Mizokuchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 373 days.

(21) Appl. No.: 11/030,945

(22) Filed: Jan. 10, 2005

(65) Prior Publication Data

US 2005/0179082 A1     Aug. 18, 2005

(30) Foreign Application Priority Data

Feb. 16, 2004  (JP)  ............................. 2004-038878

(51) Int. Cl.
    *H01L 29/38*     (2006.01)
(52) U.S. Cl. ........... 257/330; 257/E21.41; 257/E29.262
(58) Field of Classification Search ......... 257/328–330, 257/E29.2, E27.112, E21.41, E29.262
    See application file for complete search history.

(56) References Cited

U.S. PATENT DOCUMENTS

| | | | |
|---|---|---|---|
| 5,298,780 A * | 3/1994 | Harada | 257/330 |
| 6,084,264 A | 7/2000 | Darwish | |
| 6,168,996 B1 | 1/2001 | Numazawa et al. | |
| 6,174,773 B1 | 1/2001 | Fujishima | |
| 6,624,469 B1 * | 9/2003 | Harada | 257/330 |
| 6,670,658 B2 * | 12/2003 | Hattori et al. | 257/279 |
| 6,756,273 B2 * | 6/2004 | Hadizad et al. | 438/269 |
| 6,979,621 B2 * | 12/2005 | Hshieh et al. | 438/270 |
| 7,291,884 B2 | 11/2007 | Darwish et al. | |
| 2002/0060330 A1 * | 5/2002 | Onishi et al. | 257/262 |
| 2003/0003637 A1 * | 1/2003 | Ninomiya | 438/173 |

FOREIGN PATENT DOCUMENTS

| | | |
|---|---|---|
| JP | 6-53514 | 2/1994 |
| JP | 09-205204 | 8/1997 |
| JP | 2000-164869 | 6/2000 |
| JP | 2003-017699 A | 1/2003 |
| JP | 2004-525500 | 8/2004 |
| JP | 2004-535067 | 11/2004 |
| JP | 2005-210047 | 8/2005 |
| WO | WO 02/27800 A2 | 4/2005 |

OTHER PUBLICATIONS

US Office Action for U.S. Appl. No. 11/016,713. Date Mailed: Jun. 7, 2006.
Japanese Office Action issued in Japanese Patent Application No. JP 2004-299698 mailed Apr. 24, 2004.
Japanese Office Action, with English Translation, issued in Corresponding Japanese Patent Application No. 2004-038878, dated on Nov. 6, 2007.

* cited by examiner

*Primary Examiner*—Lynne A. Gurley
*Assistant Examiner*—Colleen A Matthews
(74) *Attorney, Agent, or Firm*—McDermott Will & Emery LLP

(57) ABSTRACT

A semiconductor device includes: a semiconductor substrate; a first semiconductor region formed in the reverse surface region of the semiconductor substrate and including a first conductivity type impurity; a second semiconductor region formed on the first semiconductor region in the semiconductor substrate and including a second conductivity type impurity; a third semiconductor region formed on the second semiconductor region in the semiconductor substrate and including a first conductivity type impurity; a trench passing through the second and third semiconductor regions and reaching the first semiconductor region; and a gate insulating film formed along the wall face of the trench; a gate electrode formed on the gate insulating film in the trench. Further, a pocket region including a second conductivity type impurity of which peak concentration is higher than that of the second semiconductor region is formed by a side of the trench between the second semiconductor region and the third semiconductor region.

9 Claims, 7 Drawing Sheets

SEMICONDUCTOR DEVICE AND METHOD FOR FABRICATING THE SAME

CROSS REFERENCE TO RELATED APPLICATIONS

This Non-provisional application claims priority under 35 U.S.C. §119(a) on Patent Application No. 2004-038878 filed in Japan on Feb. 16, 2004, the entire contents of which are hereby incorporated by reference.

FIELD OF THE INVENTION

The present invention relates to a semiconductor device having a trench MIS (Metal-Insulator-Semiconductor) gate structure and a method for fabricating the same.

BACKGROUND OF THE INVENTION

Conventionally, a trench gate structure in which a trench is formed in a semiconductor substrate and a gate electrode is buried in the trench is employed in semiconductor devices such as IGBTs (Insulated Gate Bipolar Transistor), MISFETs (Field Effect Transistor), and is advantageous in application to power sources and the like. For example, IGBTs having the trench gate structure have both a high-input impedance characteristic of a MISFET and a low saturation voltage characteristic of a bipolar transistor, and therefore, are utilized extensively in uninterruptible power source devices, various kinds of motor driving devices and the like.

FIG. 8 is a perspective view showing a semiconductor device having a conventional trench MOS gate structure disclosed in Japanese Patent Application Laid Open Publication No. 2003-017699A. As shown in the drawing, the conventional semiconductor device includes: a N-type base layer 101 formed in a silicon substrate; a P-type base layer 102 provided on the N-type base layer 101; a N-type source region 103 selectively formed in the P-type base layer 102; a gate insulating film 104 formed on the inner wall face of a trench T; a gate electrode 105 buried in the trench T; an insulating film 106 formed on the gate electrode 105 in the trench T; an emitter electrode 107 formed on the insulating film 106; a P-type collector layer 108 formed on the lower face of the N-type base layer 101; and a collector electrode 109 in contact with the P-type collector layer 108. Further, a P-type channel layer 112 is formed at a channel part on the side wall side of the trench T.

With the semiconductor device (MISFET) having the above trench MIS gate structure, reduction of ON resistance and high integration are enabled.

However, when the gate length is shortened in association of miniaturization of semiconductor integrated circuit devices, it is necessary to lower acceleration voltage for well implantation for minimizing the channel length and to reduce a dose amount at well implantation for restraining diffusion length from being longer. Also, it is necessary to further reduce the dose amount at well implantation for restraining an impact ionization phenomenon and for lowering the strength of an electric field to be applied to the gate insulating film at the bottom of the trench. Therefore, punch-through immunity is lowered and a controllable range of a threshold voltage Vt is restricted in the semiconductor device having the conventional trench gate structure, which are disadvantageous.

SUMMARY OF THE INVENTION

The present invention has its object of providing a semiconductor device having a trench gate structure capable of enhancing punch-through immunity of elements and enlarging a controllable range of the threshold voltage with no impact ionization phenomenon invited and without increase in the strength of the electric field to be applied to the gate insulating film at the bottom of the trench, and a fabricating method thereof A semiconductor device of the present invention is premised that: a first conductivity type first semiconductor region, a second conductivity type second semiconductor region and a first conductivity type third semiconductor region are formed in a reverse surface region of a substrate, on the first semiconductor region in the substrate, and on the second semiconductor region in the substrate, respectively; a trench passing through the second and third semiconductor regions and reaching the first semiconductor region is formed; and a gate insulating film and a gate electrode are formed in the trench. In the semiconductor device, a pocket region including a second conductivity type impurity of which peak concentration is higher than that of the second semiconductor region is provided by a side of the trench between the second semiconductor region and the third semiconductor region where a current flows.

With this arrangement, the peak concentration of the impurity in the region where the current flows is in pinpoint increase, so that a barrier in the region where the current flows becomes high. Hence, punch-through is hard to occur even when high voltage is applied between the first semiconductor region and the third semiconductor region, with a result that the punch-through immunity can be enhanced. Further, the threshold voltage can be controlled according to the peak concentration of the pocket region, and therefore, the degree of freedom of a controllable range of the threshold voltage can be increased. Moreover, the pocket region does not influence the impurity distribution in the PN junction part between the second and third semiconductor regions, and thus, no influence on expansion of a depletion layer in the PN junction part is affected. Hence, a semiconductor device in which the punch-through immunity is enhanced and the controllable range of the threshold voltage is enlarged can be provided, with no impact ionization phenomenon involved and without increase in the strength of the electric field to be applied to the gate insulating film at the bottom of the trench.

It is preferable to further provide, in the trench, an insulating film for covering the gate electrode.

If the pocket region is formed only in a region near the wall face of the trench, the peak concentration part of the second conductivity type impurity appears only at a part near the wall face of the trench.

If the pocket region is formed over the entirety of a region between the second and third semiconductor regions, the second conductivity type impurity is uniformly distributed in parallel with the principal plane of the substrate.

A semiconductor device fabrication method according to the present invention includes the steps of: forming a trench by selectively digging a semiconductor substrate in which a first conductivity type first semiconductor region and a second conductivity type second semiconductor region are formed in this order from the reverse side; and forming by ion implantation, after the formation of a gate insulating film and a gate electrode in the trench, a first conductivity type third semiconductor region on the second semiconductor region and forming a pocket region, of which peak concentration is higher than that of the second semiconductor region, between the second semiconductor region and the third semiconductor region.

By this method, a semiconductor device in which a punch-through immunity is enhanced and a controllable range of a threshold voltage is enlarged as described above can be fabricated easily.

The pocket region may be formed only in a region near the side face of the trench by tilt ion implantation through the side face of the trench or may be formed in an entire region between the second and third semiconductor regions by ion implantation to the entirety of the substrate.

Further, it is preferable to include the step of burying an insulating film on the gate electrode in the trench.

In the case employing the tilt ion implantation, it is preferable that the tilt angle in the direction of the ion implantation with respect to a direction perpendicular to the plane of the substrate is set in the range between 7 degrees and 45 degrees, and it is preferable to perform the ion implantation by two, four or eight steps.

As described above, according to the semiconductor device and the fabrication method thereof in the present invention, a semiconductor device can be provided in which the punch-through immunity is enhanced and the controllable range of the threshold voltage is enlarged. In addition, the semiconductor device according to the present invention can be applied to semiconductor devices such as MISFETs, IGBTs having a trench MIS gate structure with high breakdown voltage, which are especially used for power sources and the like.

DETAILED DESCRIPTION OF THE INVENTION

A semiconductor device and a fabrication method thereof according to embodiments of the present invention will be described below with reference to accompanying drawings. It should be noted that a MISFET having a vertical trench gate structure is referred to as one example in each embodiment but the present invention is applicable generally to semiconductor devices having a trench MIS gate structure such as vertical trench IGBTs, vertical trench MISFETs, lateral trench MISFETs. Further, a first conductivity type and a second conductivity type in the following description are set to be P-type and N-type, respectively, as one example but may be N-type and P-type, respectively.

FIRST EMBODIMENT

—Construction of Semiconductor Device—

Figure 1A:
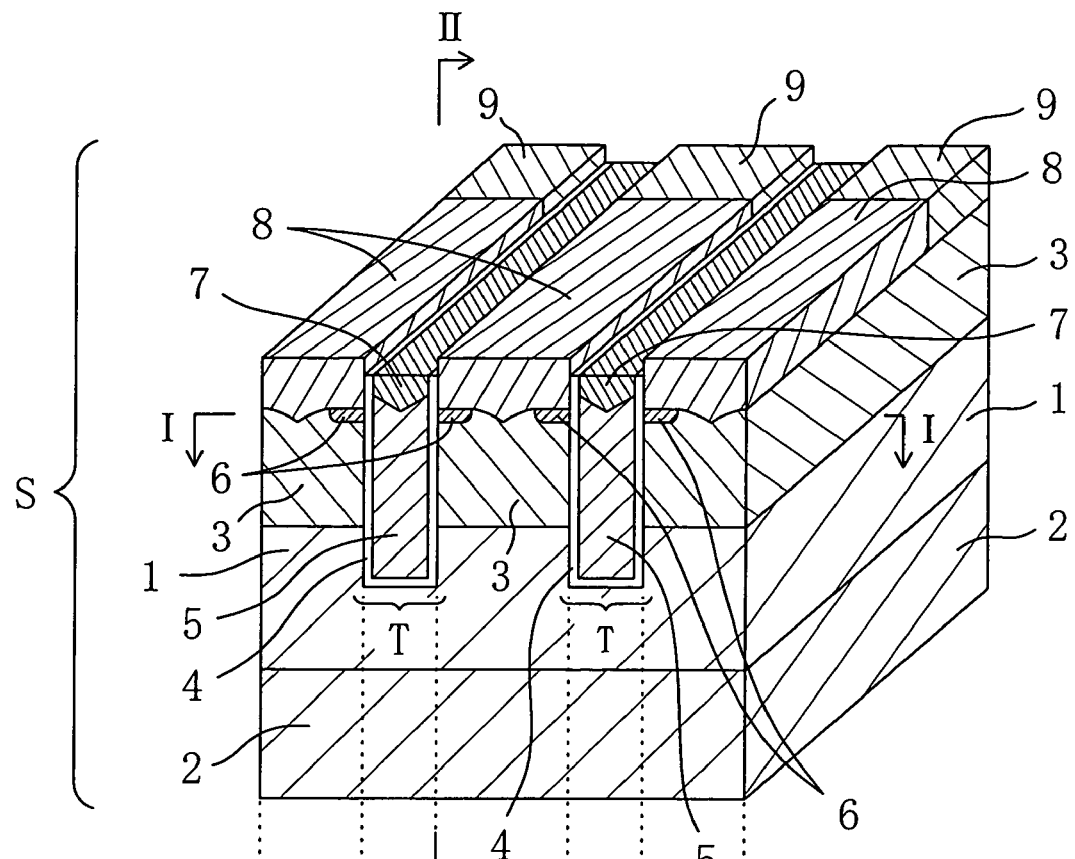
FIGS. 1A and 1B are a perspective view showing a construction of a semiconductor device having a trench gate structure according to a first embodiment and a graph illustrating impurity concentration profile in a section taken along a line I-I, respectively.
Figure 1B:
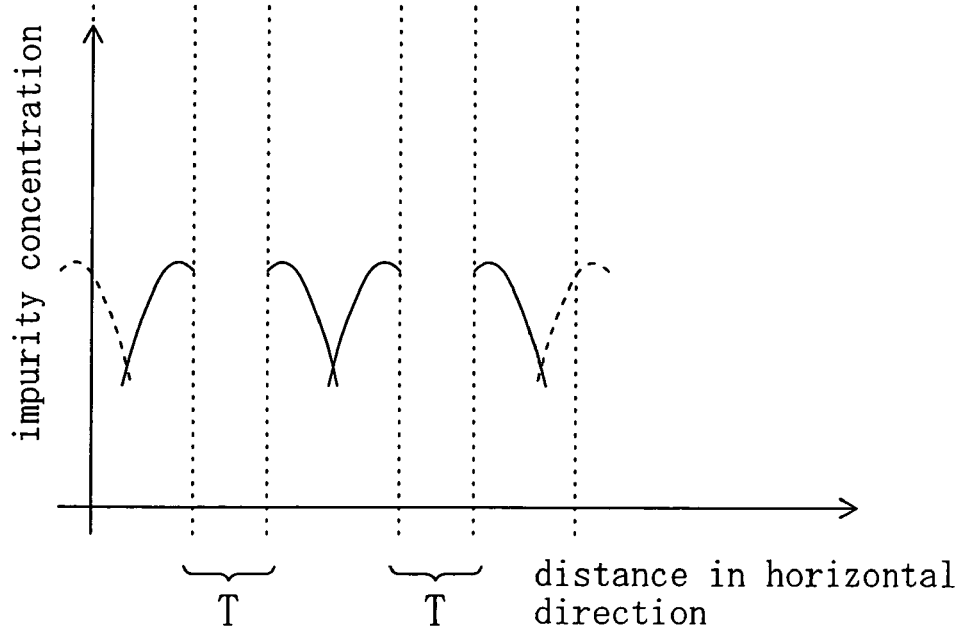
Figure 4A:
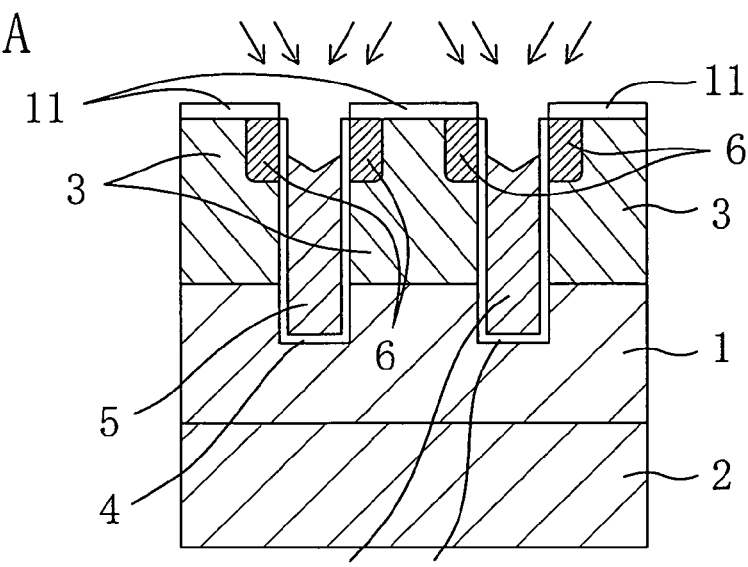
FIGS. 4A through to 4C are sections showing a latter half part of the manufacturing steps of the semiconductor device of the first embodiment.
Figure 4B:
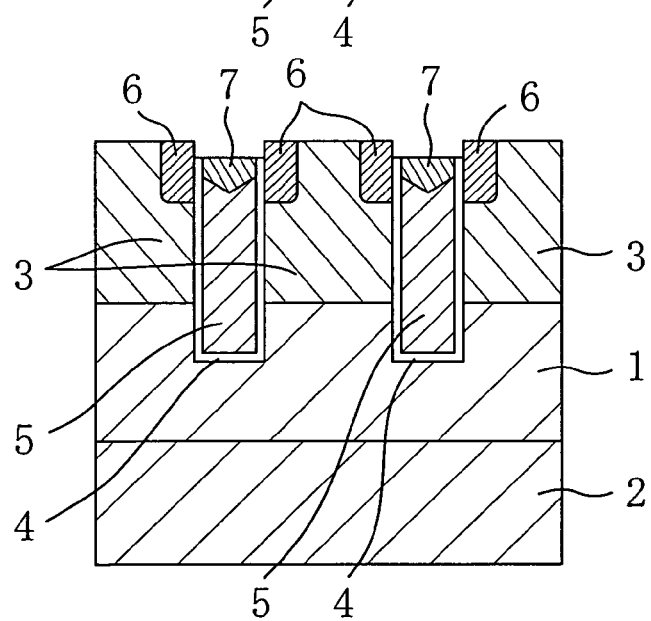
Figure 4C:
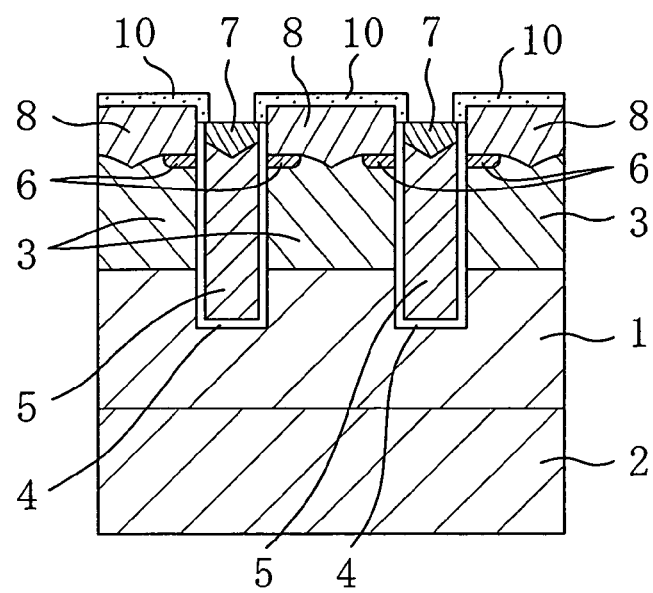

FIG. 1A and FIG. 1B are a perspective view showing a construction of a semiconductor device having a trench gate structure according to the first embodiment and a graph illustrating impurity concentration profile in a section taken along the line I-I, respectively. Wherein, a silicide layer 10 in FIG. 4C is not shown in FIG. 1A for the sake of simplification of the construction.

As shown in FIG. 1A, the semiconductor device in the present embodiment includes: a high concentration P-type drain region 2 formed in a silicon substrate S; a low concentration P-type drain region (EPI) 1 formed on the high concentration P-type drain region 2; a high concentration P-type source region 8 formed over the low concentration drain region 1; and a N-type substrate region 3 formed between the high concentration P-type source region 8 and the low concentration P-type drain region (EPI) 1. Trenches T for gate electrode formation is formed selectively, and a gate insulating film 4 and a gate electrode 5 are formed in each trench T. On the gate electrode 5, a buried insulating film 7 is formed so as to fill the trench T. A high concentration N-type substrate region 9 is formed in the surface region of the silicon substrate S other than the trenches T and the high concentration P-type source region 8. In addition, though not shown in FIG. 1A, a source electrode 10 made of a silicide film is formed on the surface of the high concentration P-type source region 8 as shown in FIG. 4C.

In the present embodiment, a N-type pocket region 6 is formed between the N-type substrate region 3 and the high concentration P-type source region 8 in a region along the side wall of each trench T. Namely, one of the significant features of the semiconductor device of the present embodiment lies in that the N-type pocket region 6 is provided, different from a semiconductor device having a conventional trench gate structure shown in FIG. 8.

FIG. 1B shows impurity distribution in a section passing through the N-type pocket region 6 and the high concentration P-type source region 8 in a direction perpendicular to the depth direction of the trenches in the silicon substrate S. As shown in FIG. 1B, the peak of the impurity concentration of the N-type pocket region 6 appears close to the gate insulating film 4.

Figure 2:
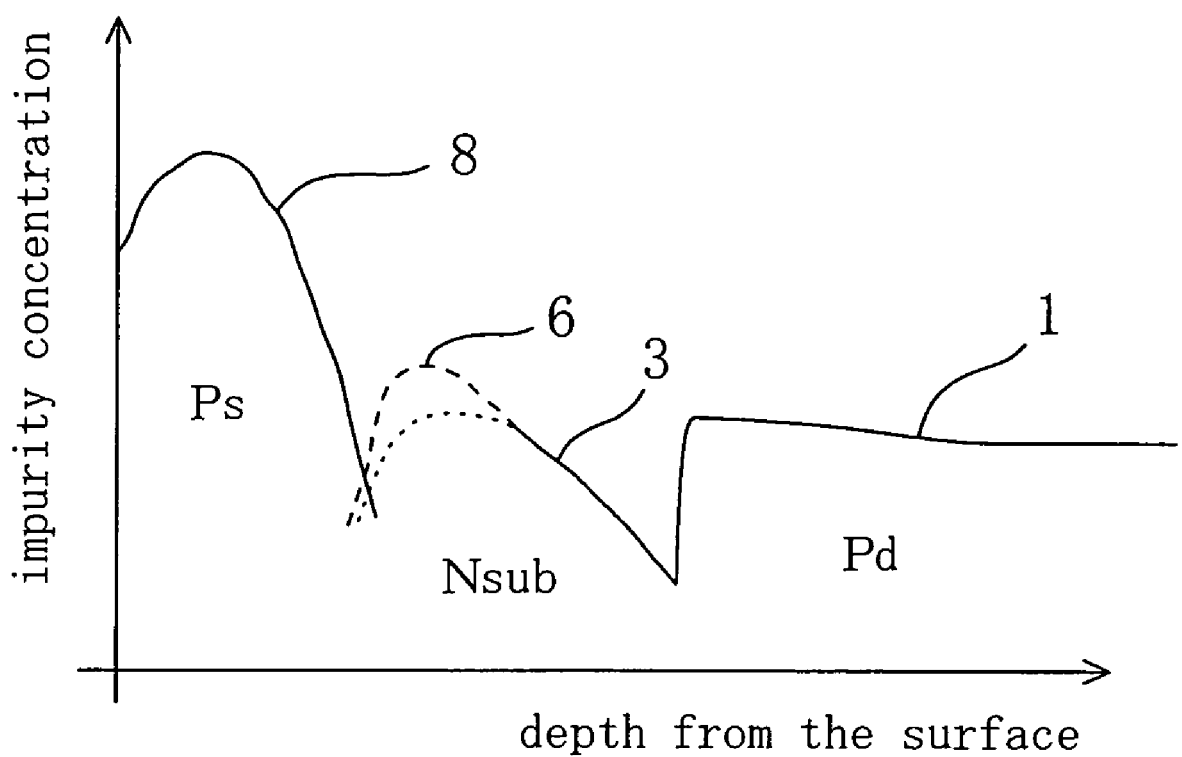
FIG. 2 is a graph illustrating impurity concentration profile in a section taken along a line II-II in FIG. 1A, of which direction is a depth direction along a trench side wall in a silicon substrate S.

FIG. 2 shows impurity concentration profile in a section taken along the line II-II in FIG. 1A, which is a depth direction along the trench side wall in the silicon substrate S. The axis of abscissas indicates the depth from the upper face of the silicon substrate S down to below along the side wall of the trench T, and the axis of ordinates indicates the impurity concentration. In FIG. 2, Ps denotes the P-type impurity concentration profile of the high concentration P-type source region 8, Nsub denotes the N-type impurity concentration profile of the N-type substrate region 3, and Pd denotes the P-type impurity concentration profile of the low concentration P-type drain region (EPI) 1. Both the P-type impurity concentration and the N-type impurity concentration increase as they go upward as shown in FIG. 2. Further, in FIG. 2, the broken line extending from the solid line for the N-type substrate region 3 indicates the N-type impurity concentration profile of the N-type pocket region 6 in the present invention and the dotted line indicates the N-type impurity concentration profile of the N-type substrate region 3 where the N-type pocket region 6 is not formed. In other words, the doted line in FIG. 2 corresponds to the P-type impurity concentration profile of a P-type channel region 112 in the conventional semiconductor device shown in FIG. 8.

Figure 8:
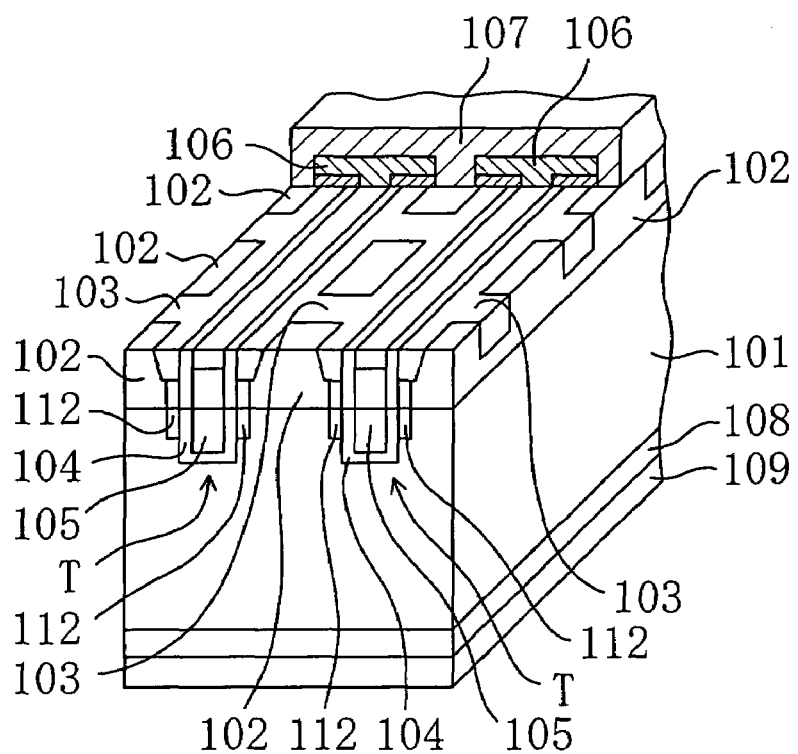
FIG. 8 is a perspective view showing a construction of a semiconductor device having a conventional trench MIS gate structure.

As can be understood from FIG. 2, in comparison with the semiconductor device having the conventional trench gate structure shown in FIG. 8, the formation of the N-type pocket region 6 in the semiconductor device of the present embodiment leads to pinpoint increase in peak concentration of the impurity at a part corresponding to the channel region of the N-type substrate region 3.

Hence, according to the semiconductor device of the present embodiment, the formation of the N-type pocket region 6 increases the height of the barrier in the channel region between the source and the drain, as shown in FIG. 2. Further, punch-through is hard to occur even when high voltage is applied to the drain, with a result that the punch-through immunity can be enhanced.

Moreover, the threshold voltage Vt can be controlled according to the peak concentration of the N-type pocket region 6 indicated by the broken line in FIG. 2, thereby increasing the degree of freedom in the controllable range of the threshold voltage Vt.

Furthermore, the N-type pocket region 6 does not affect the impurity distribution in the PN junction part between the low concentration drain region 1 and the N-type substrate region 3, and therefore, no influence is involved on expansion of a depletion layer of the PN junction part between the low concentration drain region 1 and the N-type substrate region 3.

Thus, with the semiconductor device having the trench structure of the present embodiment, enhancement of the punch-through immunity in the MISFET and increase in the controllable range of the threshold voltage Vt are enabled with no impact ionization phenomenon invited and without increase in strength of the electric field to be applied to the gate insulating film 4 at the bottom of each trench. Also, miniaturization of the transistors can be realized.

—Fabrication Process—

Figure 3A:
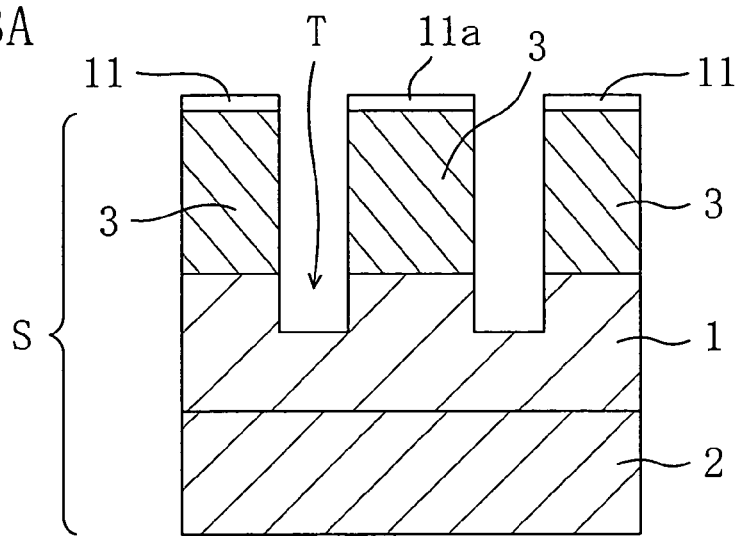
FIGS. 3A through to 3C are sections showing a former half part of manufacturing steps of the semiconductor device of the first embodiment.
Figure 3B:
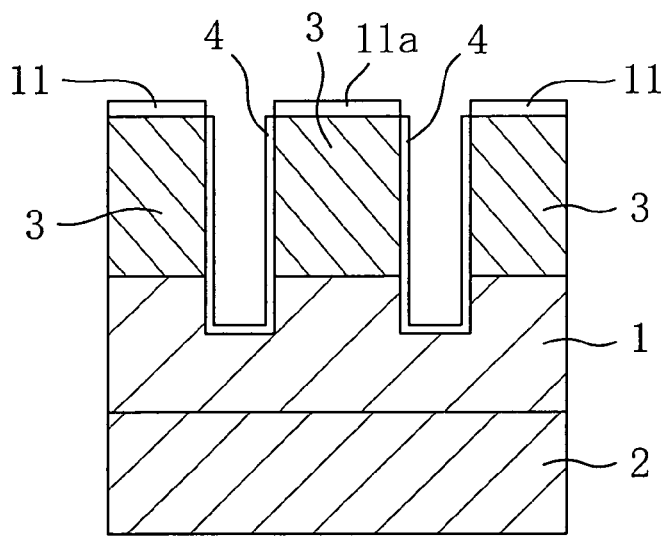
Figure 3C:
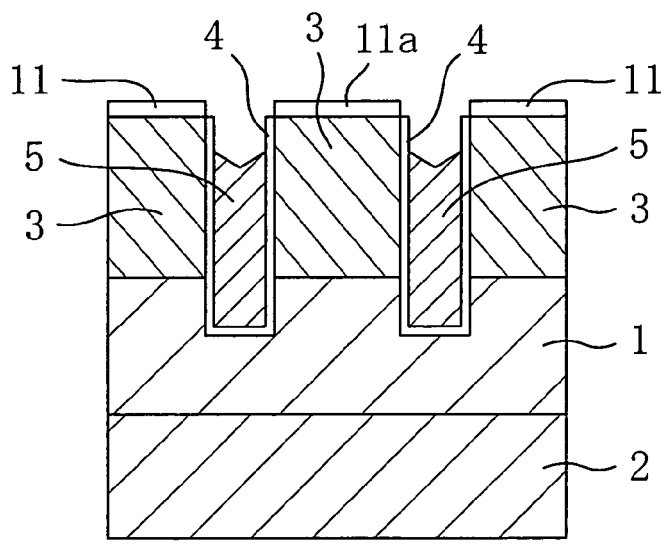

FIGS. 3A to FIG. 3C are sections showing a former half of a fabrication method for the semiconductor device in the first embodiment. FIGS. 4A to FIG. 4C are sections showing a latter half of the fabrication method for the semiconductor device in the first embodiment.

First, in the step shown in FIG. 3A, after a high concentration P-type drain region 2 (100 nm in thickness) including a P-type impurity at a concentration of about $3 \times 10^{19}$ cm$^{-3}$ and a low concentration P-type drain region 1 (5 nm in thickness) including a P-type impurity at a concentration of about $3 \times 10^{16}$ cm$^{-3}$ are formed, N-type impurity is implanted to the upper part of the low concentration P-type drain region 1 by ion implantation under the conditions of implantation energy at 600 keV and dose amount of $1.5 \times 10^{13}$ cm$^{-2}$ to form a N-type substrate region 3 having a depth of 1 μm. Then, after a mask oxide film 11 for trench opening is formed, dry etching is performed to form trenches T (250 nm in width) that pass through the N-type substrate region 3 and reach a part of 1.3 μm in depth of the P-type drain region 1.

Next, in the step shown in FIG. 3B, after a sacrificial oxide film is formed on the wall face of each trench T for planerization of the wall face of each trench T, the sacrificial oxide film is removed by wet etching. Then, thermal oxidation is performed to form a gate insulating film 4 of 30 nm in thickness on the wall face of each trench T.

Subsequently, in the step shown in FIG. 3C, after a polysilicon film (not shown) of 400 nm in thickness, which is to be a gate electrode 5, is deposited on the substrate S, a P-type impurity ion is implanted to the polysilicon film. Then, the polysilicon film is etched back so that the polysilicon film is buried in a part of the trench other than the upper part of the trench T, thereby forming the gate electrode 5. In this time, it is preferable to set a gap from the upper face of the silicon substrate to the upper face of the gate electrode 5 to be in the range between about 200 to 500 nm.

Next, in the step shown in FIG. 4A, after an ion introducing mask 11, which is made of a silicon oxide film or the like and is open at a part corresponding to the trench T, is formed, a N-type impurity ion (arsenic or phosphorous) is implanted obliquely by utilizing the gap between the silicon substrate S and the gate electrode 5 so that the impurity passes through the gate insulating film 4 of the side wall of each trench T to enter into the inside of the silicon substrate S and passes through the upper part of gate electrode 5 and the gate insulating film 4 to enter into the inside of the silicon substrate S. In this time, it is preferable to set the tilt angle of the ion implantation with respect to a direction perpendicular to the plane of the substrate to be in the range between 7 degrees and 45 degrees. Further, it is preferable to perform two-step, four-step or eight-step implantation in order to prevent formation of asymmetric impurity distribution. In the case using phosphorous, it is preferable to perform four-turn implantation under the conditions of implantation energy at 400 keV, dose amount of $2 \times 10^{13}$ cm$^{-2}$ and implantation angle at 20 degrees. This step may be performed after the step shown in FIG. 4B only if it is performed before formation of an insulating film 7 in this embodiment.

Subsequently, in the step shown in FIG. 4B, after a BPSG film is deposited, a thermal treatment at 850° C. is performed for reflowing the BPSG film. Then, the BPSG film is etched back to form a buried insulating film 7 on the gate electrode 5 in the trench T for capping. Then, though not shown in the section of FIG. 4B, a high concentration N-type substrate region 9 shown in FIG. 1A is selectively formed by ion implantation using a photoresist mask.

Next, in the step shown in FIG. 4C, boron is implanted using a photoresist mask covering the high concentration N-type substrate region 9 under conditions of implantation energy at 60 keV, and dose amount of $4 \times 10^{15}$ cm$^{-2}$ to selectively form a high concentration P-type source region 8. Further, a silicide region 10 (not shown in FIG. 1A) is formed so as to cover the high concentration P-type source region 8 and the high concentration N-type substrate region 9.

Though the steps thereafter is not illustrated, an interlaying insulating film, a contact plug, a wiring to be connected to the contact plug are formed on the substrate by conventional techniques, respectively.

In the fabrication step of the present embodiment, tilt ion implantation is performed utilizing the gap at the wall part of each trench T. This enables to form the N-type pocket region 6 in a limited minuscule region. Hence, a semiconductor device fabrication method can be provided which is suitable to enhance the punch-through immunity, to increase the controllable range of the threshold voltage and for miniaturization.

SECOND EMBODIMENT

—Construction of Semiconductor Device—

Figure 5C:
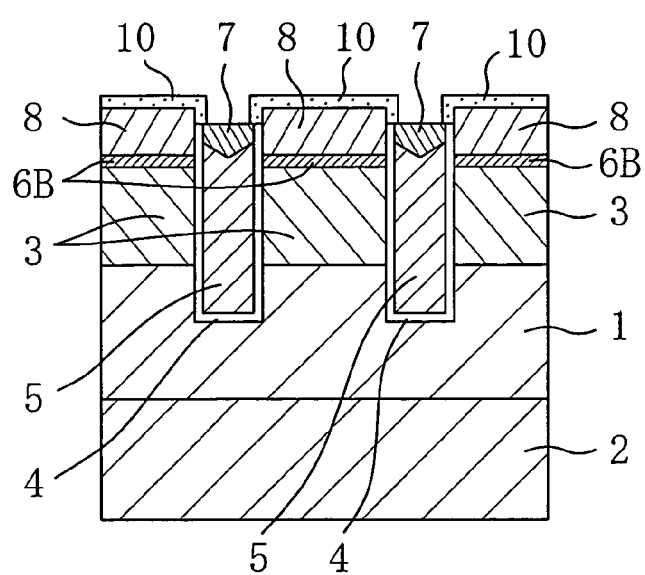
Figure 6A:
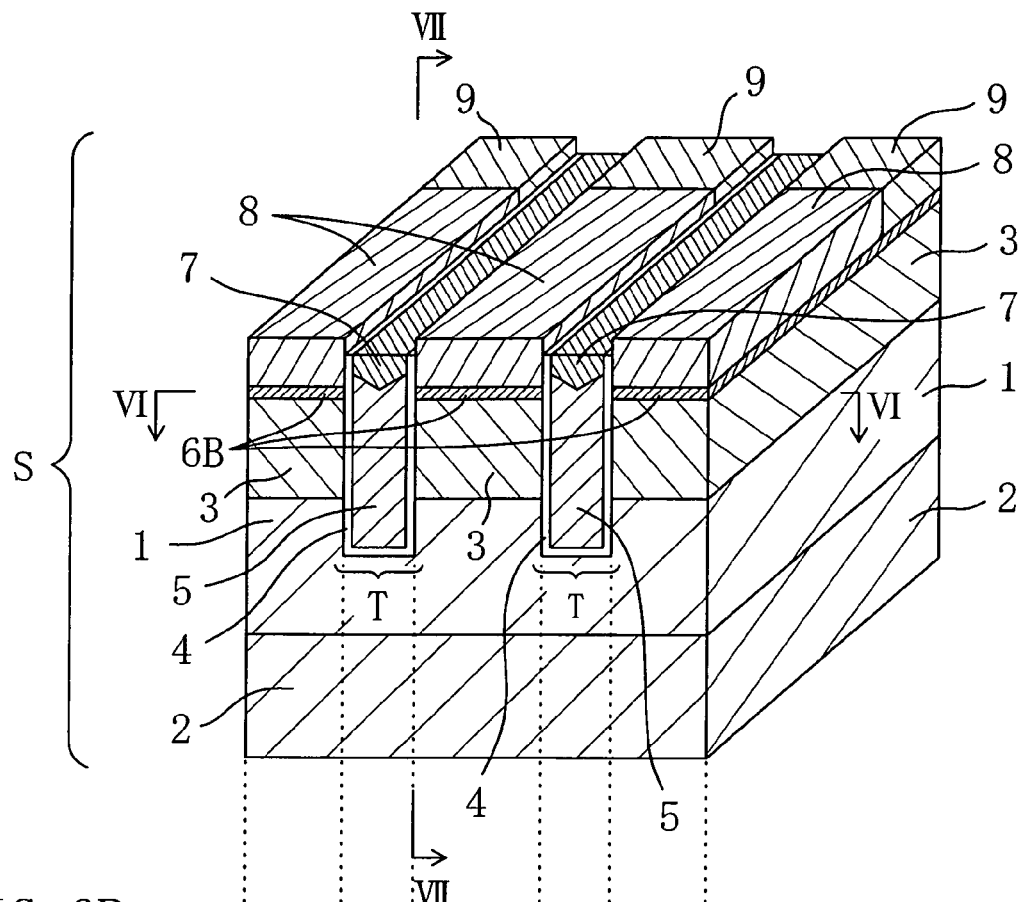
FIGS. 6A and 6B are a perspective view showing a construction of the semiconductor device having a trench gate structure according to the second embodiment and a graph illustrating impurity concentration profile in a section taken along a line VI-VI, respectively.
Figure 6B:
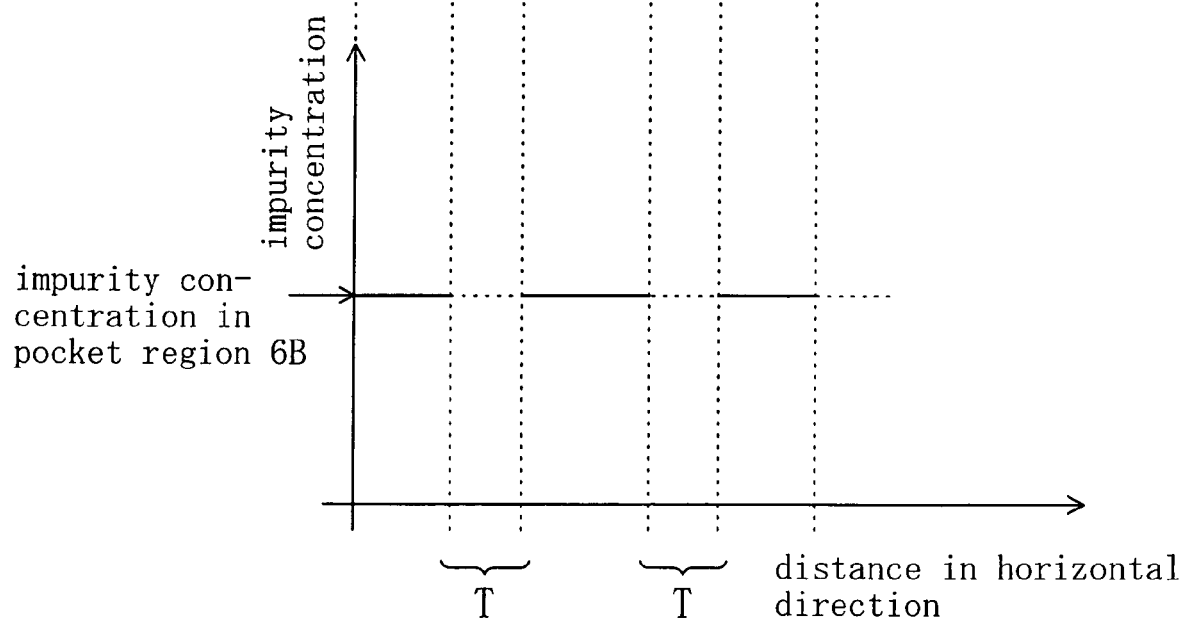

FIG. 6A and FIG. 6B are a perspective view showing a semiconductor device having a trench gate structure according to the second embodiment and a graph illustrating impurity concentration profile in a section taken along the line VI-VI, respectively. Wherein, a silicide layer 10 in FIG. 5C is not shown in FIG. 6A for the sake of simplification of the structure. The construction of the semiconductor device of the present embodiment is basically the same as that in the first embodiment (see FIG. 1A), except the N-type pocket region 6, and description of the members having the same structures is omitted.

As shown in FIG. 6A, a N-type pocket region 6B is formed entirely in a region between the N-type substrate region 3 and the high concentration P-type source region 8 in the semiconductor device of the present embodiment. Namely, one of the significant features of the semiconductor device of the present embodiment lies in that the N-type pocket region 6B in a plate shape extending in parallel with the plane of the substrate is provided, different from the semiconductor device of the first embodiment show in FIG. 1A.

FIG. 6B shows impurity distribution in a section passing the N-type pocket region 6B in a direction perpendicular to the depth direction of the trench in the silicon substrate S. As shown in FIG. 6B, the impurity concentration of the N-type pocket region 6B is substantially uniform.

Figure 7:
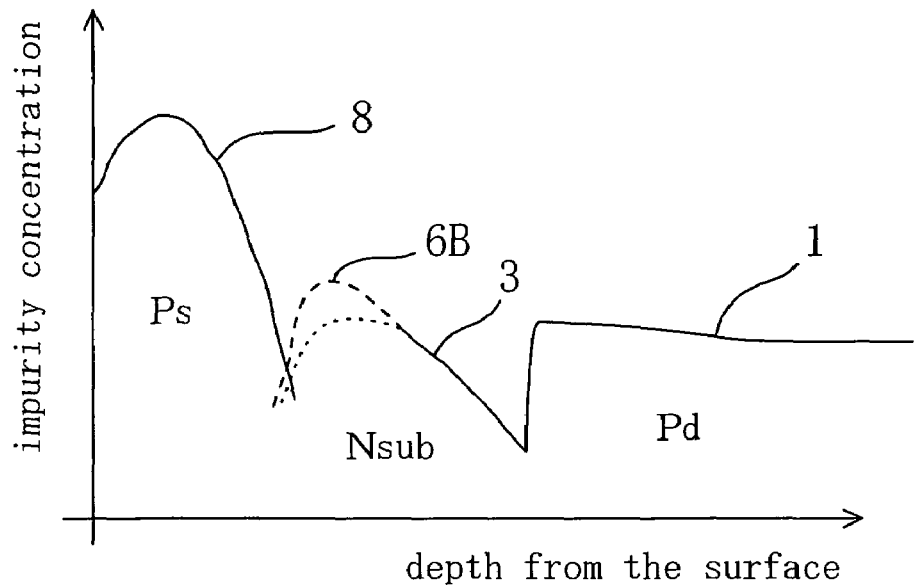
FIG. 7 is a graph illustrating impurity concentration profile in a section taken along a line VII-VII in FIG. 6A, of which direction is a depth direction along a trench side wall in a silicon substrate S.

FIG. 7 shows impurity concentration profile in a section taken along the line VII-VII in FIG. 6A, which is a depth direction along the trench side wall of the silicon substrate S. The axis of abscissas indicates the depth from the upper face of the silicon substrate S down to below along the side wall of the trench T, and the axis of ordinates indicates the impurity concentration. In FIG. 7, Ps denotes the P-type impurity concentration profile of the high concentration P-type source region 8, Nsub denotes the N-type impurity concentration profile of the N-type substrate region 3, and Pd denotes the P-type impurity concentration profile of the low concentration P-type drain region (EPI) 1. Both the P-type impurity concentration and the N-type impurity concentration increase as they go upward in FIG. 7. Further, in FIG. 7, the broken line extending from the solid line for the N-type substrate region 3 indicates the N-type impurity concentration profile of the N-type pocket region 6B in the present invention and the dotted line indicates the N-type impurity concentration profile of the N-type substrate region 3 where the N-type pocket region 6B is not formed. In other words, the doted line in FIG. 7 corresponds to the P-type impurity concentration profile of the P-type channel region 112 in the conventional semiconductor device shown in FIG. 8.

As can be understood from FIG. 7, in comparison with the semiconductor device having the conventional trench gate structure shown in FIG. 8, the formation of the N-type pocket region 6B in the semiconductor device of the present embodiment also leads to pinpoint increase in peak concentration of the impurity at a part corresponding to the channel region of the N-type substrate region 3.

Hence, according to the semiconductor device in the present embodiment, the formation of the N-type pocket region 6B increases the height of the barrier in the channel region between the source and the drain, as shown in FIG. 7. Further, punch-through is hard to occur even in the case when high voltage is applied to the drain, with a result that punch-through immunity can be increased.

Moreover, the threshold voltage Vt can be controlled according to the peak concentration of the N-type pocket region 6B indicated by the broken line in FIG. 7, thereby increasing the degree of freedom in the controllable range of the threshold voltage Vt.

Furthermore, the N-type pocket region 6B does not affect the impurity distribution at the PN junction part between the low concentration drain region 1 and the N-type substrate region 3, and therefore, no influence is involved on expansion of a depletion layer of the PN junction part between the low concentration drain region 1 and the N-type substrate region 3.

Thus, with the semiconductor device having the trench structure of the present embodiment, similar to the first embodiment, enhancement of the punch-through immunity in the MISFET and increase in the controllable range of the threshold voltage Vt are enabled with no impact ionization phenomenon invited and without increase in strength of the electric field to be applied to the gate insulating film 4 at the bottom of each trench. Also, miniaturization of the transistors can be realized.

—Fabrication Process—

Figure 5A:
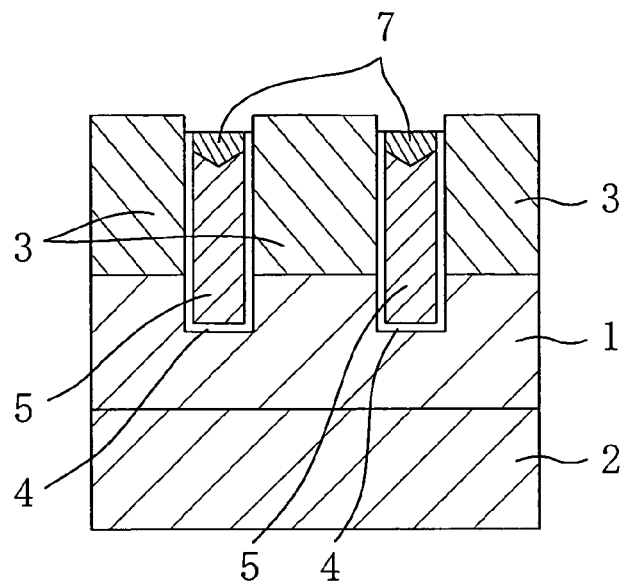
FIGS. 5A through to FIG. 5C are sections showing only a latter half part of manufacturing steps of a semiconductor device of a second embodiment.
Figure 5B:
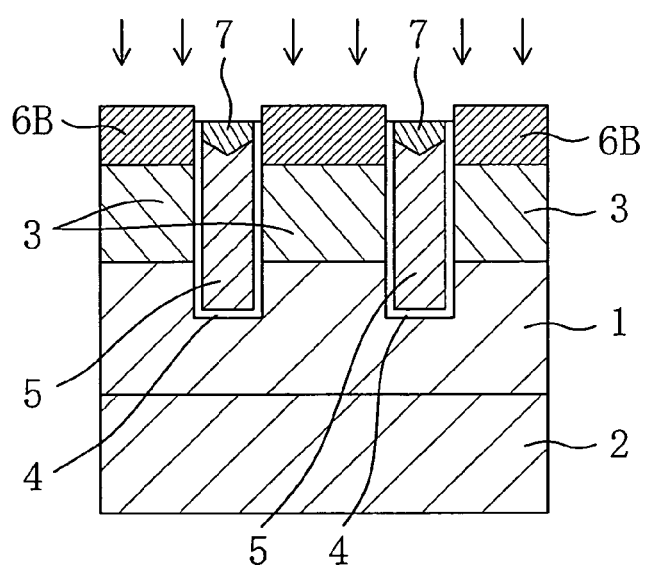

FIG. 5A to FIG. 5C are sections showing a latter half of a fabrication method for the semiconductor device in the second embodiment. The former half of the fabrication method in the present embodiment is the same as those shown in FIG. 3A to FIG. 3C in the first embodiment, and the illustration and description thereof are omitted.

In the step shown in FIG. 5A, after deposition of a PBSG film, a thermal treatment at 850° C. is performed for reflowing the BPSG film. Then, the BPSG film is etched back to form a buried insulating film 7 on the gate electrode 5 in the trench T for capping.

Next, in the step shown in FIG. SB, a N-type impurity ion (phosphorous or arsenic) is implanted along a substantially perpendicular direction so that the impurity is introduced into the entirety of the silicon substrate, thereby forming the N-type pocket region 6B. In this time, it is desirable to set the tilt angle of the ion implantation with respect to the direction perpendicular to the plane of the substrate to be equal to or below 5 degrees. In the case using arsenic, it is desirable to set the conditions of implantation energy, dose amount and implantation angle to be 400 keV, $8 \times 10^{13}$ cm$^{-2}$ and 0 degree, respectively. It is noted that this step may be performed after the following step shown in FIG. 5C.

Subsequently, ion implantation is performed using a photoresist mask to selectively form a high concentration N-type substrate region 9 shown in FIG. 6A, though not shown in the section of FIG. 5B.

Thereafter, in the step shown in FIG. 5C, boron ion is implanted using a photoresist mask covering the high concentration N-type substrate region 9 under the condition of implantation energy at 60 keV and dose amount of $4 \times 10^{15}$ cm$^{-2}$ to selectively form a high concentration P-type source region 8. Further, a silicide region 10 (not shown in FIG. 6A) is formed so as to cover the high concentration P-type source region 8 and the high concentration N-type substrate region 9.

Though the steps thereafter are not illustrated, an interlaying insulating film, a contact plug and a wiring to be connected to the contact plug are formed by conventional techniques, respectively.

In the fabrication method of the present embodiment, the N-type pocket region 6B is formed before or after the formation of the high concentration P-type source region 8 and the thermal treatment for reflowing the BPSG film, which is to be the buried insulating film 7, is not interposed, so that expansion by diffusion of the N-type pocket region 6B can be more suppressed than that in the first embodiment. Hence, a more sharp peak in the N-type pocket region 6B can be obtained, with a result that a semiconductor device fabrication method can be provided which is suitable to enhance the punch-through immunity and to increase the controllable range of the threshold voltage Vt and for miniaturization.

The present invention is applied to a P-channel MISFET in the first and second embodiments, but the present invention is applicable to N-channel MISFETs and further to IGBTs.

What is claimed is:

1. A semiconductor device, comprising:
a semiconductor substrate;
a first conductivity type drain region provided in a lower part of said semiconductor substrate;
a second conductivity type substrate region provided on said drain region in said semiconductor substrate;
a first conductivity type source region provided on said substrate region in said semiconductor substrate;
a trench formed in said semiconductor substrate and reaching said drain region;
a gate insulating film provided at least on a side wall of said trench;
a gate electrode provided on said gate insulating film in said trench;
a second conductivity type pocket region provided between said substrate region and said source region and being in contact with said source region;
an insulating film formed in said trench to cover said gate electrode and having an upper end located lower than an upper surface of said semiconductor substrate;
a source electrode provided above said source region; and
a second conductivity type high concentration substrate region formed so as to be adjacent to said source region on said substrate region in said semiconductor substrate and having an impurity concentration higher than that of said substrate region,
wherein said gate insulating film is in contact with said substrate region and said pocket region at said side wall of said trench, and
said source electrode is in contact with an upper surface of said source region, and in contact with a portion of a side surface of said source region which is located above said upper end of said insulating film in said trench.

2. The semiconductor device of claim 1, wherein said pocket region is formed only under a portion of said source region, the portion being close to said side wall of said trench.

3. The semiconductor device of claim 1, wherein
said pocket region is formed under an entire portion of said source region.

4. The semiconductor device of claim 1, wherein said pocket region has a peak of impurity concentration higher than that of said substrate region.

5. The semiconductor device of claim 1, wherein said drain region includes: a first conductivity type high concentration drain region; and a first conductivity type low concentration drain region provided on said high concentration drain region.

6. The semiconductor device of claim 1, wherein
said source electrode is made of a suicide film.

7. The semiconductor device of claim 1, wherein
an upper end of a part where said gate electrode is in contact wit said gate insulating film is located upper than a boundary between said source region and said pocket region.

8. The semiconductor device of claim 1, wherein a peak of impurity concentration of said pocket region is located close to said gate insulating film in a direction perpendicular to the depth direction of said trench in said semiconductor substrate.

9. The semiconductor device of claim 1, wherein said substrate region is to be a channel region.

* * * * *

UNITED STATES PATENT AND TRADEMARK OFFICE
CERTIFICATE OF CORRECTION

| | |
|---|---|
| PATENT NO. | : 7,626,229 B2 |
| APPLICATION NO. | : 11/030945 |
| DATED | : December 1, 2009 |
| INVENTOR(S) | : Miyata et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 364 days.

Signed and Sealed this

Second Day of November, 2010

David J. Kappos
*Director of the United States Patent and Trademark Office*